United States Patent [19]

Hotta et al.

[11] Patent Number: 4,844,851

[45] Date of Patent: Jul. 4, 1989

[54] SURFACE METALLIZING METHOD

[75] Inventors: Hiroshi Hotta; Yoshiharu Suzuki, both of Fuji, Japan

[73] Assignee: Polyplastics Co., Ltd., Osaka, Japan

[21] Appl. No.: 102,241

[22] Filed: Sep. 28, 1987

Related U.S. Application Data

[63] Continuation of Ser. No. 644,907, Aug. 28, 1984, abandoned.

[51] Int. Cl.$^4$ .................... B32B 15/08; C23C 16/00
[52] U.S. Cl. .................... 264/129; 204/192.1; 427/124; 427/250
[58] Field of Search ............ 264/129, 1.9, 1.1, 1.7, 264/81; 428/31, 458; 524/605, 413; 427/250, 124, 296; 204/192.14, 192.1

[56] References Cited

U.S. PATENT DOCUMENTS

| | | | |
|---|---|---|---|
| 4,011,193 | 3/1977 | Wambach | 524/413 |
| 4,022,748 | 5/1977 | Schlichting | 524/413 |
| 4,296,178 | 10/1981 | Griesenauer et al. | 428/462 |
| 4,369,222 | 1/1983 | Hedrick et al. | 264/61 |
| 4,429,004 | 1/1984 | Breitenfellner | 428/324 |

*Primary Examiner*—Jan H. Silbaugh
*Assistant Examiner*—Mary Lynn Fertig
*Attorney, Agent, or Firm*—Burns, Doane, Swecker and Mathis

[57] ABSTRACT

A surface metallizing method for application in producing a metallized polybutylene terephthalate part is conducted by using a molded part consisting chiefly of a polybutylene terephthalate resin composition containing 2–40% by weight of potassium-titanate fiber relative to the total weight of the composition, and subjecting the molded part to sputtering or vacuum metallizing, thereby forming a metallized coat thereon.

8 Claims, No Drawings

SURFACE METALLIZING METHOD

This application is a continuation of application Ser. No. 644,907 filed Aug, 28, 1984, now abandoned.

The present invention relates to a method of surface metallizing, that is, sputtering or vacuum metallizing, as employed in producing polybutylene terephthalate parts suitable for use as automobile, electrical, and other industrial components.

For the purpose of surface-metallizing polybutylene terephthalates, it is desirable that the finished surface should have a mirror-like surface, and that the metallized coat should be free from crazing and hand well to the substrate. For surface-metallizing polyethylene terephthalates, known processes include sputtering and vacuum metallizing processes along with plating processes and ion plating. However, if polybutyleneterephthalate parts are surface-metallized by any of these methods, the metallized surface is often subject to crazing because of the considerable difference in linear expansion coefficient between the molded part and the metallized coat. Furthermore, since polybutylene terephthalate resin is a crystalline resin, it is subject to shrinkage overtime, resulting in craizing of the metallized coat. The plate adhesion may also be adversely affected.

In order to overcome these difficulties, the general practice is to mix glass fiber, glass flake, mica, or the like with the polybutylene terephthalate resin, and then subjecting the mixture to sputtering or vacuum metallizing. In this way, the metallized coat may be prevented from crazing, but a problem is that a tortuous pattern may develop on the surface of the finished product, adversely affecting the mirror finish. Development of a tortuous pattern on the surface of the molded part is attributable to the anisotropy of the polybutylene terephthalate resin or matrix resin at the time of shrinkage. The anisotropy is accounted for by the presence of filler mixed with the matrix resin. In the case of glass-fiber-reinforced polybutylene terephthalate resin, the difference in mold shrinkage between resin adjacent the glass fiber and resin at other locations, at the time of mold solidification, causes irregularities in the surface producing the tortuous pattern. The magnitude of such tortuous pattern or undulation is influenced by the configuration, and more particularly the size, of the filler mixed with the resin.

As a result of research efforts to develop a metallizing method which eliminate these difficulties, the present inventors found that it is possible to obtain a surface-metallized part having a mirror-like surface which is not subject to crazing due to temperature changes or the like, by mixing polybutylene terephthalates with potassium-titanate fiber and subjecting the mixture to sputtering or vacuum metallizing. This finding has led to the present invention. The invention has another advantage in that it improves coat adhesion.

The present invention provides a method of producing a metallized polybutylene terephthalate part, which comprises using a molded part consisting chiefly of a polybutylene terephthalate resin composition containing 2–40% by weight of potassium-titanate fiber relative to the total weight of the composition, and subjecting the molded part to sputtering or vacuum metallizing, thereby forming a metallized coat thereon.

Potassium-titanate fibers used for the purpose of the invention refer to white, needle-shape single-crystal fibers having a chemical composition expressed by $K_2O \cdot nTiO_2$ (where n is 1 or more). The average length of the fibers is 5-50$\mu$, preferably 10-20$\mu$, and the average diameter thereof is 0.1-0.8$\mu$, preferably 0.2-0.5$\mu$. The amount of potassium-titanate fibers added to the polybutylene terephthalates is such that it constitutes 2-40% by weight, preferably 3-30% by weight, relative to the resulting composition as a whole.

Heretofore, potassium-titanate fibers have been used simply for producing a white color in resins. By this invention, however, it has been proved that polybutylene terephthalates containing potassium-titanate fibers provide various advantages such as good coat adhesion, good surface mirror-effect, and high craze resistance, if the surface is metallized by sputtering or vacuum deposition. Needless to say, potassium-titanate fibers can serve as a good reinforcement for the polybutylene terephthalates, depending upon the amount added.

A known surface treatment may be used in order to strengthen the bond between the potassium-titanate fibers and the resin. for example, silane coupling agents, such as amino-silne and epoxy-silane, and titanate coupling agents may be used for the purpose. Most preferable are silane coupling agents.

In the method of the present invention, potassium-titanate fibers may be used in the form of a mixture with some other filler. For example, any of the following may be used as such filler: calcium carbonate having a mean particle diameter of 4$\mu$ or below, kaolin or any material of the kaolin group (including kaolinite, sericite, etc.) having a crystal form of hexagonal plate with a mean particle diameter of 0.1-0.3$\mu$, wollastonite having a block shape of 10$\mu$ or below in mean particle diameter, and processed mineral fiber having a mean fiber length of 4-6$\mu$ and an aspect ratio of 40-60 (as composed of 43% $SiO_2$, 39% CaO, and 8% $Al_2O_3$, for example).

Polybutylene terephthalates available for the purpose of the present invention are not limited to polybutylene terephthalate resins alone. They may take the form of a copolymer consisting chiefly of polybutylene terephthalate or may be used in mixture with other thermoplastic resins. For example, they may be mixed with any of the following: polyolefins such as polyethylene and polypropylene, ethylene carboxylate copolymers such as ethylene alkylacrylate copolymer and the like, vinyl compounds such as polystyrene, and styrene-butadiene-acrylonitrille copolymer, polyesters such as polyethyelene terephthalate and polycarbonate, rubber-like materials such as polybutadiene and the like, and derivatives of these materials. Further, it is possible to introduce into the polybutylene terephthalates any multipolymer consisting of polyacrylate, any elastomer such as segment-type copolyester, any stabilizer, surface-active agent, or the like.

The mixture of potassium-titantate fiber with polybutylene terephthalate resin may be extruded according to a conventional method. For the purpose of sputtering or vacuum metallizing, any method can be used which is conventionally employed with respect to resins having good coating performance such as ABS and the like. After the molded part is degreased with a suitable solvent, the molded part is coated of witha base coat of urethane or acrylic urethane or acrylic ester; then the coat is dried. Sputtering or vacuum metallizing is effected thereafter. When a sputtering apparatus is employed,chrome alloy or aluminum is evaporated under an argon gas pressure of $1 \times 10^{-3} - 2 \times 10^{-4}$ Torr to produce a thin metallic layer of 300-100 Å on the molded part, thereby imparting metallic luster to the part. when a metallizing apparatus is employed, aluminum is evaporated under a pressure of $1\times10^{-3}-1\times10^{-4}$ Torr to form a thin metallic layer of 200-500 Å on the part, thereby imparting metallic luster to the part. For general-purpose uses, it is a usual practice to protect the metal layer by applying a top coat to the metal layer. The product thus obtained has a mirror-like surface and its metallized coat is strongly bonded to the substrate, and is free from the possibility of crazing due to temperature changes or the like. Thanks to these excellent properties, the metallized products can be advantageously utilized in various industrial applications.

EXAMPLE 1

Potassium-titanate fiber was added to polybutylene terephthalate (Polyplastics K.K.'s product; trade name: Juranex) so that the former amounted to 15 wt % relative to the total weight of the composition. Employing a molding machine, the composition was injection-molded into a flat plate. After degreasing, the plate was coated with base coat EXP1474U/EXP1475C (weight ratio 100/30), manufactured by Fujikura Kasei K.K., and was then subjected to forced drying for 60 min at 140° C.

Subsequently, chrome alloy was sputtered employing a sputtering apparatus and under an argon gas pressure of $1\times10^{-3}$ Torr to form a layer 400-500 Å in thickness on the plate. The layer was coated with top coat EXP1380, a product of Fujikura Kasei K.K., and then subjected to forced drying for 30 min at 70° C. The metalized part was visually evaluated as to its appearance. The part was found to have a mirror-like surface and good luster. The metallized coat was not subject to crazing. To evaluate the bond of the metallized coat to the base coat, rule lines were drawn crosswise by knife on the coat, 11 lines each way, to form 100 checkers; and the checkers were subjected to Scotch tape test, a forced peel test, using JIS adhesive cellophane tape. The result was that all the checkers remained unpeeled.

EXAMPLE 2

A molded part containing 7.5% by weight of potassiumtitanate fiber was prepared. The part was metallized on the surface by sputtering as in Example 1. In this case, too, the part had a mirror-like surface, with good luster, and no crazing was obseerved. The bond strength of the coat was also evaluated using the forced peel test described in Example 1. The result was that all the checkers (100) remained unpeeled.

EXAMPLE 3

A molded part containing 4.3% by weight of potassium-titanate fiber was prepared. The part was metallized by sputtering and evaluated in the same manner as in Example 1. In this case, too, good results were obtained in all respects: mirror-like appearance, crazing, and a strongly bonded coat (with all checkers remaining unpeeled).

EXAMPLE 4

The potassium-titanate fiber contained in the composition was 30% by weight. After molding, the part was metallized sputtering and evaluated in the same manner as in Example 1. Evaluation results were good in all respects: mirror-like appearance, no crazing, and good bond strength of the coat (with all the checkers remaining unpeeled).

EXAMPLE 5

A molded part containing 15% by weight of potassiumtitanate fiber and 5% by weight of polycarbonate was metallized by sputtering as in Example 1. Good results were seen in all respects: nirror-like appearance, no crazing, and good bond strength of the coat (with all the checkers remaining unpeeled).

EXAMPLE 6

In examples 1 to 5, vacuum metallization with aluminum was carried out instead of sputtering. Evaluation was made in the same way as in the other examples. Vacuum metallization was effected by employing a vacuum metallizing apparatus so as to produce an aluminum layer 3-400 Å in thickness on the molded part. The product obtained had a mirror-like appearance on the surface and no crazing was observed. The bond of the coat to the substrate was satisfactory (with all the checkers remaining unpeeled).

REFERENCE EXAMPLE 1

A flat plate was molded from a polybutylene terephthalate composition that did not contain potassium-titanate fiber. The Plate was metallized by sputtering as in Example 1. The Product had a mirror-like surface and good luster, but crazing was observed.

REFERENCE EXAMPLE 2

A part was molded from a composition containing 30% glass fiber. Sputtering was effected as in Example I. No crazing was observed, but the appearance did not have a mirror-like luster.

REFERENCE EXAMPLE 3

The composition of Reference Example 2 was reformulated to contain 17% by weight glass fiber instead of 30% by weight glass fiber; The molded part was subjected to sputtering. The product did not have a mirror-like luster.

REFERENCE EXAMPLE 4

Glass fiber was added in corresponding amount in place of potassium-titanate fiber. Sputtering was effected as in Example 1. The product was not satisfactory in appearance in this case either; a mirror-like luster was not obtained.

REFERENCE EXAMPLE 5

Reference Examples 1 to 4 were repeated but vacuum metallization with aluminum was effected in place of sputtering. the products were evaluated in the same manner. The results were no better than those in Reference Examples 1 to 4.

We claim:

1. A process for forming a metallized, molded article, comprising injection molding an article from a composition comprising polybutylene terephthalate and 2 to 40 wt. %, based on the total weight of the composition, of needle-shaped, single crystal potassium titanate fibers having an average length of 5 to 50 microns and an average diameter of 0.1 to 0.8 micron and then forming on a surface of the molded article by sputtering, a metal layer having a mirror-like appearance.

2. The process of claim 1 wherein the fibers are present in the composition in an amount of from 3 to 30 wt. %, based on the total weight of the composition.

3. The process of claim 1 wherein the fibers have an average length of 10 to 20 microns and an average diameter of 0.2 to 0.5 micron.

4. The process of claim 1 wherein an aluminum or chrome alloy layer 100 to 300 angstroms thick is applied by sputtering.

5. The process of claim 1 wherein the composition includes a filler.

6. The process of claim 5 wherein the filler is selected from the group consisting of calcium carbonate having a mean particle diameter of 4 microns or below, kaolin, kaolinite, sericite having a crystal form of hexagonal plate with a mean particle diameter of 0.1 to 0.3 micron, wollastonite having a block shape of 10 microns or below in mean particle diameter and processed mineral fiber having a mean fiber length of 4 to 6 microns and an aspect ratio of 40 to 60.

7. The process of claim 1 wherein the composition includes an additional thermoplastic resin.

8. The process of claim 7 wherein the additional thermoplastic resin is polyethylene terephthalate.

* * * * *